(12) United States Patent
Ho et al.

(10) Patent No.: US 8,188,806 B2
(45) Date of Patent: May 29, 2012

(54) TUNER AND TRANSFORMER FORMED BY PRINTED CIRCUIT BOARD THEREOF

(75) Inventors: Wen-Po Ho, Tainan County (TW); Shun-Chi Chuang, Tainan County (TW)

(73) Assignee: Himax Technologies Limited, Tainan (TW)

( * ) Notice: Subject to any disclaimer, the term of this patent is extended or adjusted under 35 U.S.C. 154(b) by 781 days.

(21) Appl. No.: 11/939,716

(22) Filed: Nov. 14, 2007

(65) Prior Publication Data

US 2009/0066448 A1 Mar. 12, 2009

(30) Foreign Application Priority Data

Sep. 7, 2007 (TW) ................................ 96133476 A

(51) Int. Cl.
*H03H 7/38* (2006.01)
*H03J 3/20* (2006.01)
(52) U.S. Cl. .............................. 333/32; 333/177; 334/45
(58) Field of Classification Search .................. 333/173, 333/174, 32, 177; 334/15, 65–84, 45; 455/340, 455/285, 197.2
See application file for complete search history.

(56) References Cited

U.S. PATENT DOCUMENTS

| | | | | |
|---|---|---|---|---|
| 4,363,009 A | * | 12/1982 | Malcolm et al. | 333/177 |
| 4,662,001 A | * | 4/1987 | Cruz et al. | 455/340 |
| 5,020,146 A | * | 5/1991 | Pugel | 455/195.1 |
| 5,285,179 A | * | 2/1994 | Wignot et al. | 334/15 |
| 5,347,245 A | * | 9/1994 | Wright, Jr. | 333/131 |
| 5,425,167 A | * | 6/1995 | Shiga et al. | 29/606 |
| 6,177,964 B1 | * | 1/2001 | Birleson et al. | 348/725 |
| 6,330,138 B1 | * | 12/2001 | Kwon | 361/58 |
| 6,850,127 B2 | * | 2/2005 | Sakakura et al. | 333/25 |
| 7,629,860 B2 | * | 12/2009 | Liu et al. | 333/25 |

OTHER PUBLICATIONS

Rudolf F. Graf, "Modern Dictionary of Electronics", 1999, Published by Butterworth-Heinemann, 7th Ed., p. 365.*

* cited by examiner

*Primary Examiner* — Dean O Takaoka
*Assistant Examiner* — Alan Wong
(74) *Attorney, Agent, or Firm* — J.C. Patents

(57) ABSTRACT

A tuner and a transformer formed by printed circuit board thereof are provided. The transformer includes a first winding and a second winding. In which, the first winding forms a first inductor and the second winding forms a second inductor. The transformer is formed by the first and the second inductors, wherein the first winding and the second winding are formed by conducting wires of a printed circuit board.

18 Claims, 3 Drawing Sheets

TUNER AND TRANSFORMER FORMED BY PRINTED CIRCUIT BOARD THEREOF

CROSS-REFERENCE TO RELATED APPLICATION

This application claims the priority benefit of Taiwan application serial no. 96133476, filed on Sep. 7, 2007. All disclosure of the Taiwan application is incorporated herein by reference. The entity of the above-identified patent application is hereby incorporated by reference herein and made a part of specification.

BACKGROUND OF THE INVENTION

1. Field of the Invention

The present invention relates to a tuner, and more particularly to a tuner, in which a printed circuit board is used for substituting a conventional air coil.

2. Description of Related Art

With the development of digital compression technique, global television broadcast system have changed from analog television broadcast system to digital television broadcast system, development of digital broadcast techniques has led to a quick development of the related industry, wherein digital televisions (DTVs) and set-top boxes (STBs) are structural elements of a digital broadcasting system, and a tuner circuit is a key of the DTV and STB or a mobile receiving system.

The tuner is used for amplifying a received radio frequency (RF) signal and descending a frequency of the received RF signal to an intermediate frequency (IF), and then a back-end decoder may decode the received RF signal. A function of the tuner is to select a desired channel and filter the undesired channels, and to avoid an interference exerted on the desired channel by the undesired channels during a frequency descending. Moreover, the received signal is a broadband signal due to carry of multi-channels, and therefore the tuner should have a broadband design, so as to entirely receive and process the received signal.

In the tuner, due to a relatively great frequency bandwidth and differences of the tuner ICs, different bands (VHF-H, VHF-L, UHF) require different impedance matching circuits. Air coils may be applied to a tracking filter, an oscillator, and a signal coupling and impedance matching circuit within a conventional tuner, by which the air coils may be used for adjusting a resonant frequency and an impedance matching.

Since the air coils are relatively large in size, and have to be manually assembled and adjusted during production, production cost is increased due to large size of the components. Meanwhile, excessive manual operation cannot facilitate mass production, and may greatly decrease a throughput and adversely influence the profit and the competitiveness of the product.

SUMMARY OF THE INVENTION

Accordingly, to overcome the short comings of a conventional signal coupling and impedance matching circuit, the present invention proposes an impedance matching circuit suitable for a transformer formed by printed circuit board with two layers or more to achieve a function of a conventional tuner, and method thereof in which air coils and manual adjusting of air coils are omitted.

The present invention provides a tuner including a tuner integrated circuit and an impedance matching circuit. The impedance matching circuit includes a transformer, a first matching circuit and a second matching circuit. The transformer includes a first winding and a second winding, wherein the first winding has a first end and a second end, the second winding has a third end and a fourth end, and the first winding and the second winding are formed by conducting wires of a printed circuit board. The first matching circuit is coupled to the first end and the second end, and the second matching circuit is coupled to the third end and the fourth end.

The present invention further provides an impedance matching circuit including the first winding, the second winding and the first matching circuit. The first winding has the first end and the second end, the second winding has the third end and the fourth end, and the first winding and the second winding form the transformer. The first matching circuit is coupled to the first end and the second end of the first winding. The first winding and the second winding are formed by conducting wires of the printed circuit board, and are allocated in an adjacent position to form the transformer.

The present invention further provides a transformer including a first winding and a second winding, coupling of the two windings may substitute an air coil of a conventional tuner circuit, wherein the first winding and the second winding are formed by conducting wires of the printed circuit board.

In summary, the required transformer is formed by the conducting wires of the printed circuit board by means of layout, by which the conventional air coils are substituted. Therefore, manual adjustment is unnecessary for the signal coupling and impedance matching circuit applying the transformer of the present invention, and the size of the circuit and the cost of the components are reduced. Moreover, in a design of the impedance matching circuit, a compensation inductance is used for adjusting a matching impedance and a resonant frequency, such that not only is a conventional specification matched, but also a larger compatible space may be provided.

In order to make the aforementioned and other objects, features and advantages of the present invention comprehensible, a preferred embodiment accompanied with figures is described in detail below.

DESCRIPTION OF EMBODIMENTS

The First Embodiment

Figure 1:
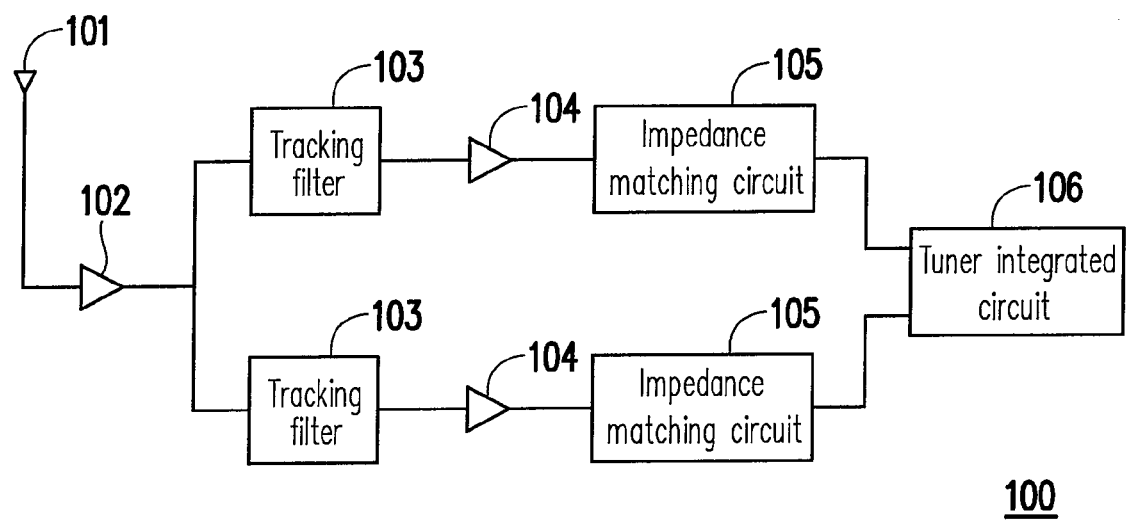
FIG. 1 is a block diagram of a tuner according to an exemplary embodiment of the present invention.

FIG. 1 is a block diagram of a tuner 100 according to an exemplary embodiment of the present invention. Referring to FIG. 1, the tuner 100 includes an antenna 101, a front-end amplifier 102, a tracking filter 103, a secondary amplifier 104, an impedance matching circuit 105 and a tuner integrated circuit 106. A transformer formed by conducting wires of a printed circuit board may be respectively applied to the tracking filter 103, the impedance matching circuit 105 and the tuner integrated circuit 106 for substituting a conventional air coil.

The Second Embodiment

Figure 2:
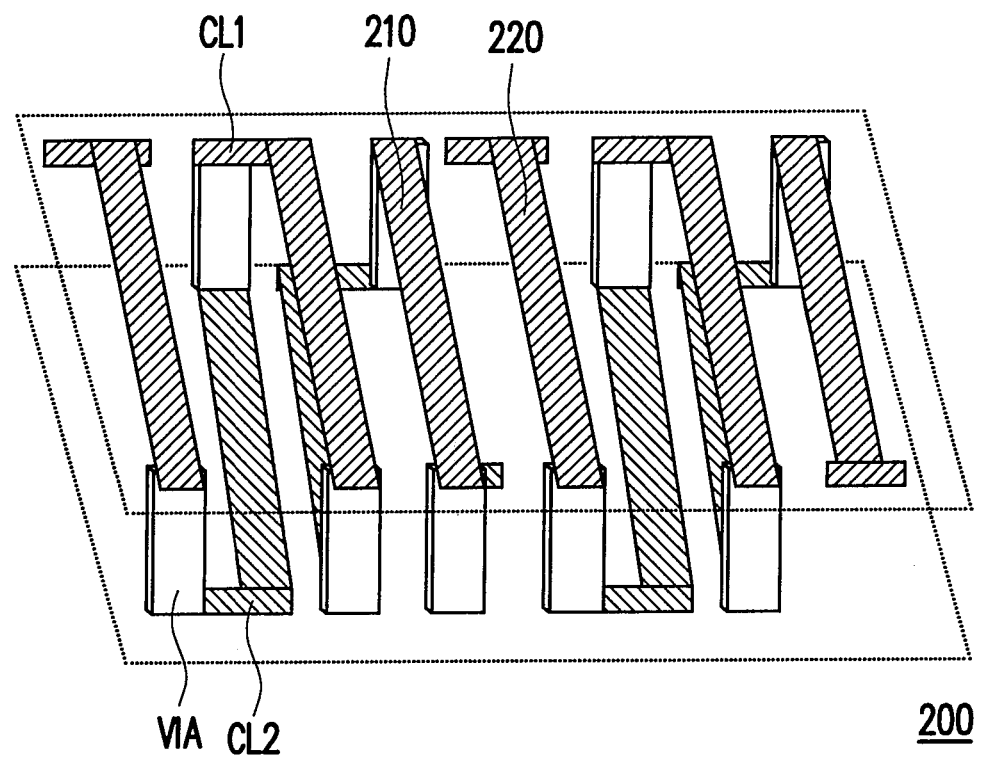
FIG. 2 is a structural diagram of a transformer according to a second embodiment of the present invention.

FIG. 2 is a structural diagram of a transformer according to the second embodiment of the present invention. A first winding 210 and a second winding 220 formed by conducting wires on the printed circuit board are disposed opposite to form a transformer 200. In the present embodiment, the printed circuit board has two conductor layers connected with each other by vias, for example through via, blind via or buried via. The first winding 210 and the second winding 220 may form a rectangular winding through the two conductor (metal) layers (for example, CL1, CL2) and the VIAs, as shown in FIG. 2.

Figure 3:
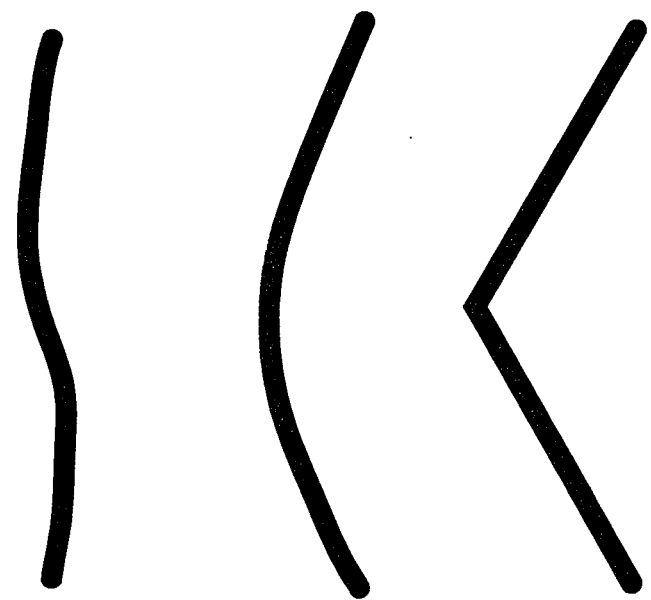
FIG. 3 is a diagram illustrating different layout patterns of conducting wires according to the second embodiment.

The layout of the first winding 210 and the second winding 220 are not limited to a rectangle, which may also be an arc or a triangle, as shown in FIG. 3. FIG. 3 is a diagram illustrating different layout patterns of conducting wires according to the first embodiment. The first winding 210 and the second winding 220 may have different designs of the conductor layers based on different layout patterns thereof, and may be connected by the vias to form a structure similar to a coil. Therefore, the first winding 210 and the second winding 220 may all function as an inductor. By signal coupling between the first winding 210 and the second winding 220, the structure then may function as the transformer.

In the design of the transformer 200, features of the transformer 200 may be adjusted by modifying the winding turns and wiring patterns of the first winding 210 and the second winding 220, or by adjusting a distance or an allocation (for example, opposite or adjacent) of the two windings. Moreover, if the printed circuit board has more conductor layers, features of the first winding 210 and the second winding 220 may be varied according to different allocations between different layers (for example, between a top layer and a bottom layer or between random two adjacent conductor layers) to meet a requirement of a designer. If the inductance provided by the windings is insufficient, an inductive component may be directly connected to the first winding 210 or the second winding 220 through conducting wires to adjust an equivalent inductance value thereof. Other feasible layouts may be deduced by analogy by those skilled in the art according to a disclosure of the present invention, and the detailed description thereof will no be repeated.

In the present embodiment, the first winding forms a rectangular coil and functions as an inductor. The second winding also forms a rectangular coil and functions as another inductor. Coupling of the two adjacent allocated windings forms a transformer circuit. The winding turns, width and length of the first and the second windings may all be changed according to a required inductance of the transformer. When a fabrication of the printed circuit board is completed, the fabrication of the transformer circuit is completed accordingly, and manual adjustment is unnecessary. During a massive production, the circuit may also have a higher uniformity.

The Third Embodiment

Figure 4:
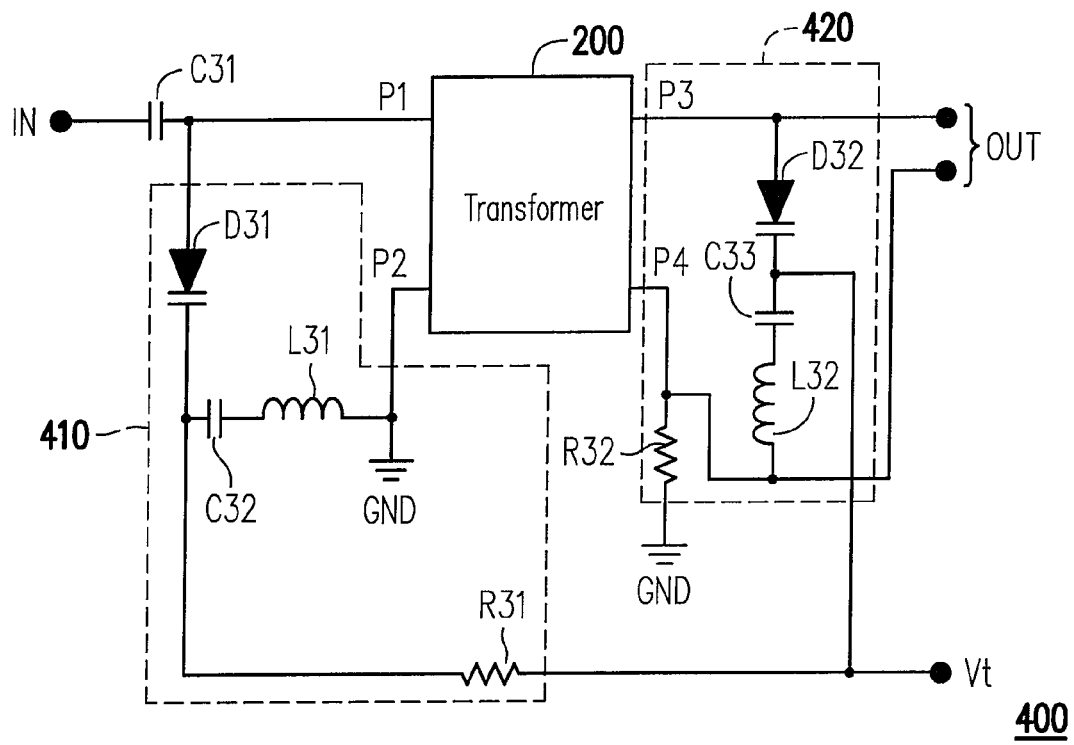
FIG. 4 is a circuit diagram of an impedance matching circuit according to a third embodiment of the present invention.

FIG. 4 is a circuit diagram of an impedance matching circuit according to the third embodiment of the present invention. The impedance matching circuit 400 includes the transformer 200, a first matching circuit 410 and a second matching circuit 420. The first matching circuit 410 includes a resistor R31, a varactor D31, a compensation inductor L31 and a capacitor C32. The second matching circuit 420 includes a resistor R32, a varactor D32, a compensation inductor L32 and a capacitor C33. The transformer 200 is formed by conducting wires of the printed circuit board, and has a structure similar to that shown in FIG. 2. The first end P1 and the second end P2 are two ends of the first winding, the third end P3 and the fourth end P4 are two ends of the second winding. The description with reference to FIG. 2 may be referred for a detailed layout of the transformer 200.

The capacitor C31 is coupled between the first end P1 and a signal input terminal IN, and coupled to the first matching circuit 410. The first matching circuit 410 is coupled to the first end P1 and the second end P2 of the transformer 200. The second matching circuit 420 is coupled to the third end P3 and the fourth end P4 of the transformer 200. In the first matching circuit 410, one end of the varactor D31 is coupled to the first end P1, and another end of the varactor D31 is coupled to an adjusting voltage VT through the resistor R31. The capacitor C32 and the compensation inductor L31 are coupled between the second end P2 and a common node located between the varactor D31 and the resistor R31, wherein the second end P2 is also coupled to a ground terminal GND. In the second matching circuit 420, the varactor D32, the capacitor C33 and the compensation inductor L32 are serially coupled between the third end P3 and the fourth end P4, and the adjusting voltage VT is coupled to a common node located between the varactor D32 and the capacitor C33 for adjusting a capacitance of the varactor D32. The resistor R32 is coupled between the fourth end P4 and the ground terminal GND. The third end P3 and the fourth end P4 of the transformer 200 form a signal output terminal OUT. The signal input terminal IN and the signal output terminal OUT may transmit RF signals.

A resonant frequency of the impedance matching circuit 400 may be dynamically adjusted by the adjusting voltage VT. When the capacitances of the varactors D31 and D32 are changed according to the adjusting voltage VT, the resonant frequency of the impedance matching circuit 400 changes accordingly. The compensation inductors L31 and L32 may be substituted by discrete components to compensate the inductance generated by the windings of the transformer 200. The first matching circuit 410 may provide the impedance matching for an input part, and the second matching circuit 420 may provide the impedance matching for an output part. The resistor R32 may adjust a real part of an output impedance to achieve the impedance matching effect.

The present embodiment may be applied to a signal coupling of an ultra high frequency (UHF), for example, applied to an impedance matching circuit between a tuner IC and a front-end amplifier of a television. By coupling of the impedance matching circuit 400, not only is the impedance matching effect achieved, but also image rejection ability is obtained. If the tuner IC having the image rejection ability is applied, a specification of a conventional tuner may be achieved and manual adjustment of the air coils may be omitted.

The Fourth Embodiment

Figure 5:
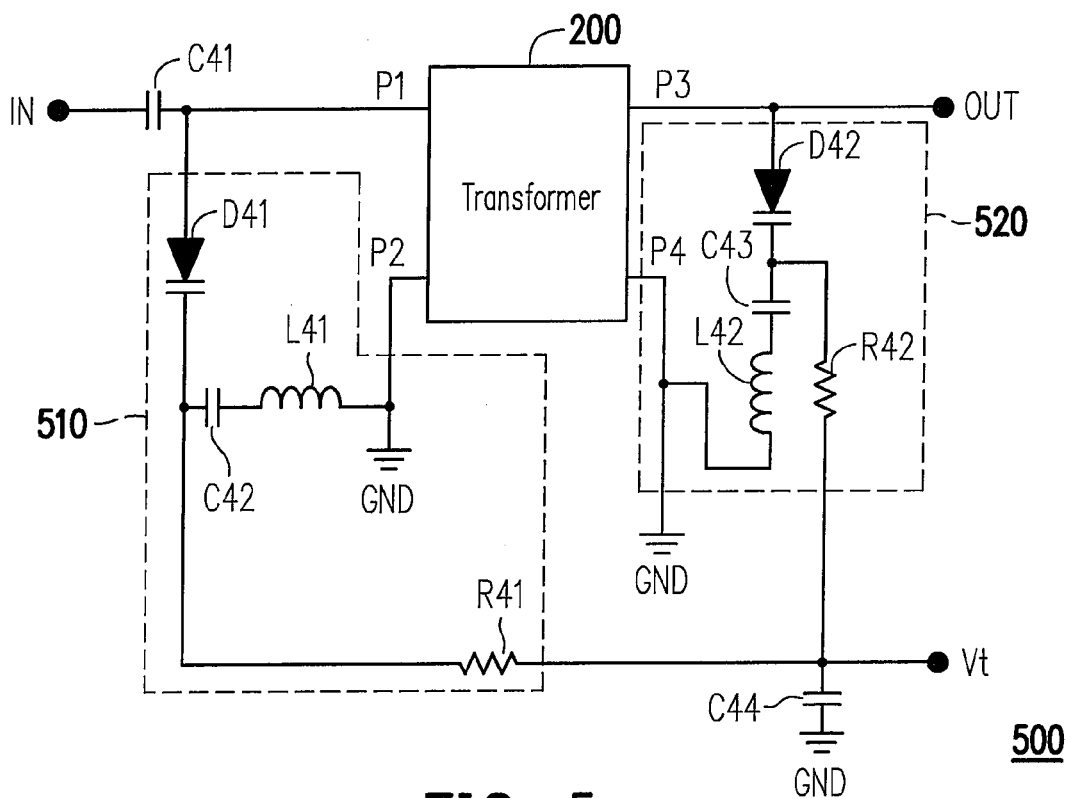
FIG. 5 is a circuit diagram of an impedance matching circuit according to a fourth embodiment of the present invention.

FIG. 5 is a circuit diagram of an impedance matching circuit according to the fourth embodiment of the present invention. The impedance matching circuit 500 includes the transformer 200, a first matching circuit 510 and a second matching circuit 520. The first matching circuit 510 includes a resistor R41, a capacitor C42, a compensation inductor L41 and a varactor D41. The second matching circuit 520 includes a resistor R42, a varactor D42, a compensation inductor L42 and a capacitor C43. The transformer 200 is formed by conducting wires of the printed circuit board, and has a structure similar to that illustrated in FIG. 2. The first end P1 and the second end P2 are two ends of the first winding, the third end P3 and the fourth end P4 are two ends of the second winding. Please refer to FIG. 2 for a detailed layout of the transformer 200.

The first matching circuit 510 is coupled to the first end P1 and the second end P2 of the transformer 200. The second matching circuit 520 is coupled to the third end P3 and the fourth end P4 of the transformer 200. The capacitor C41 is coupled between the first end P1 and the signal input terminal IN. In the first matching circuit 510, one end of the varactor D41 is coupled to the first end P1, and another end of the varactor D41 is coupled to the adjusting voltage VT through the resistor R41. The capacitor C42 and the compensation inductor L41 are coupled between the second end P2 and a common node located between the varactor D41 and the resistor R41, wherein the second end P2 is also coupled to the ground terminal GND. In the second matching circuit 520, the varactor D42, the capacitor C43 and the compensation inductor L42 are serially coupled between the third end P3 and the fourth end P4, wherein the fourth end P4 is also coupled to the ground terminal GND. The resistor R42 is coupled between the adjusting voltage VT and a common node located between the varactor D42 and the capacitor C43. A capacitor C44 is coupled between the adjusting voltage VT and the ground terminal GND. The third end P3 and the fourth end P4 of the transformer 200 form the signal output terminal OUT. The signal input terminal IN and the signal output terminal OUT are capable of transmitting RF signals.

A resonant frequency of the impedance matching circuit 500 may be dynamically adjusted by the adjusting voltage VT. When the adjusting voltage VT changes, the capacitances of the varactors D41 and D42 changes accordingly, so as to change the resonant frequency of the impedance matching circuit 500 to achieve a tuning function. The compensation inductors L41 and L42 may be substituted by discrete components to compensate the inductance generated by the windings of the transformer 200. The capacitor C44 is a regulation capacitor of the adjusting voltage VT. The first matching circuit 510 may provide the impedance matching for the input part, and the second matching circuit 520 may provide the impedance matching for the output part, so as to achieve the impedance matching effect.

The present embodiment may be applied to the signal coupling of a very high frequency (VHF), for example, applied to the impedance matching circuit between the tuner IC and the front-end amplifier of the television. By coupling of the impedance matching circuit 500, not only is the impedance matching effect achieved, but also image rejection ability is obtained. If the tuner IC having the image rejection ability is applied, the specification of the conventional tuner may be achieved and manual adjustment of the air coils may be omitted.

In summary, according to the present invention, the required transformer and the impedance matching circuit are formed by conducting wires of the printed circuit board for substituting the conventional air coils, by which not only is the functions of a conventional tuning technique achieved, but also size of the circuit board is reduced, such that production efficiency may be improved and production cost may be reduced. When the present invention is applied to a signal coupling or impedance matching circuit, complicated manual adjustment may be omitted, and therefore the production procedure may be further simplified, and production cost may be further reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A tuner, comprising:
a tuner integrated circuit; and
an impedance matching circuit, comprising:
a transformer, comprising:
a first winding, having a first end and a second end; and
a second winding, having a third end and a fourth end, wherein the first winding and the second winding are formed by conducting wire of a printed circuit board, the printed circuit board comprises at least a first conductor layer and a second conductor layer, a part of the first winding is formed by the first conductor layer, another part of the first winding is formed by the second conductor layer, a part of the second winding is formed by the first conductor layer, the other part of the second winding is formed by the second conductor layer, and the first conductor layer and the second conductor layer are connected by vias, wherein winding directions of the first winding and the second winding are substantially perpendicular to an arrangement direction of the first conductor layer and the second conductor layer, and a projection of the first winding on the first conductor layer and a projection of the second winding on the first conductor layer are not overlapped;
a first matching circuit, coupled to the first end and the second end; and
a second matching circuit, coupled to the third end and the fourth end.

2. The tuner as claimed in claim 1, wherein the first matching circuit comprises a first varactor, a first capacitor and a first compensation inductor.

3. The tuner as claimed in claim 1, wherein the second matching circuit comprises a second varactor, a second capacitor and a second compensation inductor.

4. The tuner as claimed in claim 1, wherein the first winding is a rectangular winding.

5. A transformer, comprising:
a first winding, forming a first inductor; and
a second winding, forming a second inductor, and the first inductor and the second inductor forming the transformer;
wherein the first winding and the second winding are formed by conducting wires of a printed circuit board, the printed circuit board comprises at least a first conductor layer and a second conductor layer, a part of the first winding is formed by the first conductor layer, the other part of the first winding is formed by the second conductor layer, a part of the second winding is formed by the first conductor layer, the other part of the second winding is formed by the second conductor layer, and the first conductor layer and the second conductor layer are connected by vias, wherein winding directions of the first winding and the second winding are substantially perpendicular to an arrangement direction of the first conductor layer and the second conductor layer, and a projection of the first winding on the first conductor layer and a projection of the second winding on the first conductor layer are not overlapped.

6. The transformer as claimed in claim 5, wherein the first winding is a rectangular winding.

7. The transformer as claimed in claim 5, wherein the second winding is a rectangular winding.

8. The transformer as claimed in claim 5, wherein the first winding is disposed adjacent to the second winding.

9. The transformer as claimed in claim 5 further comprising:
- a first compensation inductor, coupled to an end of the first winding; and
- a second compensation inductor, coupled to an end of the second winding.

10. An impedance matching circuit for a tuner, comprising:
a first winding, having a first end and a second end;
a second winding, having a third end and a fourth end, and the first winding and the second winding forming a transformer; and
a first matching circuit, coupled to the first end and the second end,
wherein the first winding and the second winding are formed by conducting wires of a printed circuit board, the printed circuit board comprises at least a first conductor layer and a second conductor layer, a part of the first winding is formed by the first conductor layer, another part of the first winding is formed by the second conductor layer, a part of the second winding is formed by the first conductor layer, the other part of the second winding is formed by the second conductor layer, and the first conductor layer and the second conductor layer are connected by vias, wherein winding directions of the first winding and the second winding are substantially perpendicular to an arrangement direction of the first conductor layer and the second conductor layer, and a projection of the first winding on the first conductor layer and a projection of the second winding on the first conductor layer are not overlapped.

11. The impedance matching circuit as claimed in claim 10, wherein the first matching circuit further comprises a first varactor, a first capacitor and a first compensation inductor.

12. The impedance matching circuit as claimed in claim 11, wherein the first varactor is coupled to the first end, the first capacitor is coupled to the first varactor, and the first compensation inductor is coupled to the first capacitor.

13. The impedance matching circuit as claimed in claim 12, wherein the first varactor is coupled to a first adjusting voltage.

14. The impedance matching circuit as claimed in claim 12, wherein the first matching circuit comprises a first resistor coupled to the first varactor.

15. The impedance matching circuit as claimed in claim 10 further comprising a second matching circuit coupled to the third end and the fourth end.

16. The impedance matching circuit as claimed in claim 15, wherein the second matching circuit comprises a second varactor, a second capacitor and a second compensation inductor.

17. The impedance matching circuit as claimed in claim 10, wherein the first winding receives an input signal, and couples the input signal to the second winding to generate an output signal.

18. The impedance matching circuit as claimed in claim 10, wherein the first winding is a rectangular winding.

* * * * *